United States Patent
Liu

(10) Patent No.: US 7,813,136 B2
(45) Date of Patent: Oct. 12, 2010

(54) SERVER ENCLOSURE

(75) Inventor: Wei-Ji Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 505 days.

(21) Appl. No.: 11/853,837

(22) Filed: Sep. 12, 2007

(65) Prior Publication Data
US 2009/0040713 A1  Feb. 12, 2009

(30) Foreign Application Priority Data
Aug. 9, 2007  (CN)  .............. 2007 2 0200801 U

(51) Int. Cl.
G06F 1/16 (2006.01)
H05K 5/00 (2006.01)
H05K 7/00 (2006.01)
H05K 7/16 (2006.01)
H05K 1/14 (2006.01)

(52) U.S. Cl. .............. 361/727; 361/679.02; 361/736
(58) Field of Classification Search ........... 361/679.02, 361/679.37, 724–728, 781, 736; 200/296, 200/314, 310; 312/223.1, 333–334
See application file for complete search history.

(56) References Cited

U.S. PATENT DOCUMENTS

| 5,138,527 | A  | * | 8/1992  | Jones ................ 361/829 |
| 5,150,092 | A  | * | 9/1992  | Kolb ................. 200/332.2 |
| 5,253,140 | A  | * | 10/1993 | Inoue et al. ........... 361/728 |
| 6,193,339 | B1 | * | 2/2001  | Behl et al. ............ 361/753 |
| 6,231,224 | B1 | * | 5/2001  | Gamble et al. ....... 361/679.33 |
| 6,275,387 | B1 | * | 8/2001  | Liao et al. ............ 361/806 |
| 6,288,333 | B1 | * | 9/2001  | Liu et al. ............. 361/724 |
| 6,522,147 | B1 | * | 2/2003  | Pickard et al. ......... 200/314 |
| 6,565,163 | B2 | * | 5/2003  | Behl et al. ........... 312/223.1 |
| 6,583,989 | B1 | * | 6/2003  | Guyer et al. ........... 361/724 |
| 6,867,701 | B2 | * | 3/2005  | Lawrence et al. ...... 361/679.4 |
| 6,982,872 | B2 | * | 1/2006  | Behl et al. .......... 361/679.48 |
| 7,259,683 | B2 | * | 8/2007  | Abe .................... 361/760 |
| 7,342,191 | B2 | * | 3/2008  | Yang et al. ............ 200/296 |
| 7,442,890 | B1 | * | 10/2008 | Chen et al. ............ 200/314 |
| 2003/0081386 | A1 | * | 5/2003 | Robillard et al. ....... 361/724 |
| 2005/0174730 | A1 | * | 8/2005 | Chen et al. ............ 361/685 |
| 2005/0201053 | A1 | * | 9/2005 | Scicluna et al. ........ 361/685 |
| 2007/0115627 | A1 |   | 5/2007 | Carlisi et al. |
| 2008/0158831 | A1 | * | 7/2008 | Cox et al. ............. 361/727 |

* cited by examiner

Primary Examiner—Jayprakash N Gandhi
Assistant Examiner—Adrian S Wilson
(74) Attorney, Agent, or Firm—Frank R. Niranjan

(57) ABSTRACT

A server enclosure includes a chassis having a sidewall, a securing bracket secured to the chassis, a receiving member attached to the securing bracket, and a switch module for powering the server on/off. The securing bracket includes a first sidewall and a second sidewall perpendicularly extending therefrom. The receiving member is secured to the second sidewall of the securing bracket and includes a first sidewall abutting the first sidewall of the securing bracket. The switch module includes a printed circuit board. The switch module is received in the receiving member with the printed circuit board parallel to the first sidewall thereof. The second sidewall of the securing bracket abuts on the receiving member to enclose the switch module therein.

16 Claims, 6 Drawing Sheets

SERVER ENCLOSURE

BACKGROUND

1. Field of the Invention

The present invention relates to server enclosures, more particularly to a server enclosure having a power button module.

2. Description of Related Art

With development of the information society, servers are playing a more and more important role in data exchange between electronic devices. Correspondingly, management of servers also becomes important to ensure the servers work normally. Typically, a switch member and a universal serial bus (USB) connector are disposed at a front end of a server chassis together with a plurality of data storage devices, such as hard disk drives in parallel, for conveniently managing or repairing the server. However, each type of server chassis has its own standard size, which cannot be changed. When abundant data storage devices are needed to be mounted in the server chassis, there will not be enough room for the switch button or USB connector being mounted in the server chassis.

What is needed, therefore, is a server enclosure having a compact structure but still able to accommodate a switch button or USB connector.

SUMMARY

A server enclosure includes a chassis having a sidewall, a securing bracket secured to the chassis, a receiving member attached to the securing bracket, and a switch module for powering the server on/off. The securing bracket includes a first sidewall and a second sidewall perpendicularly extends therefrom. The receiving member is secured to the second sidewall of the securing bracket and includes a first sidewall abutting the first sidewall of the securing bracket. The switch module includes a printed circuit board. The switch module is received in the receiving member with the printed circuit board parallel to the first sidewall thereof. The second sidewall of the securing bracket abuts on the receiving member to enclose the switch module therein.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
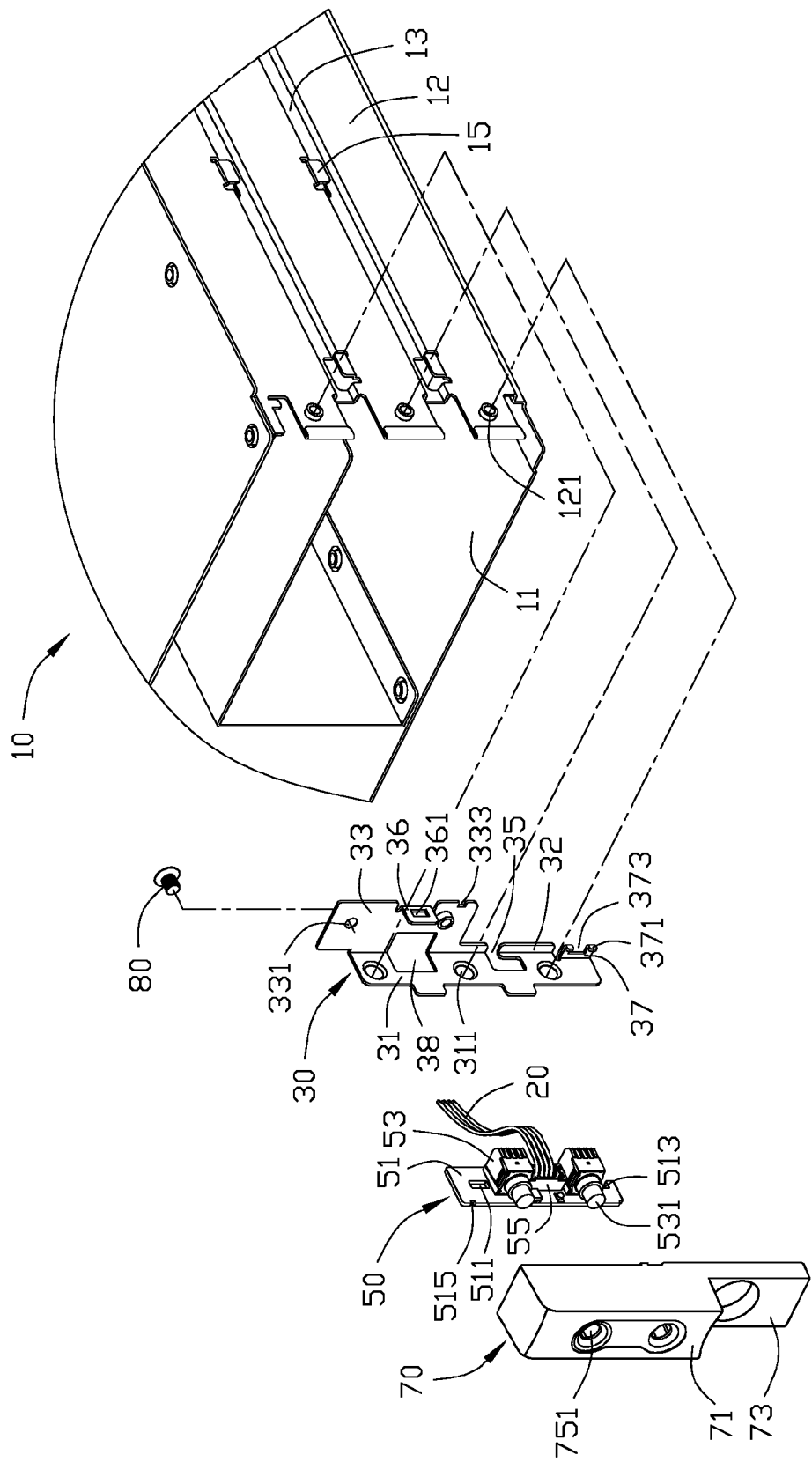
FIG. 1 is an exploded, isometric view of a server enclosure in accordance with a preferred embodiment, including a chassis, a securing bracket, a switch module, and a receiving member.
Figure 2:
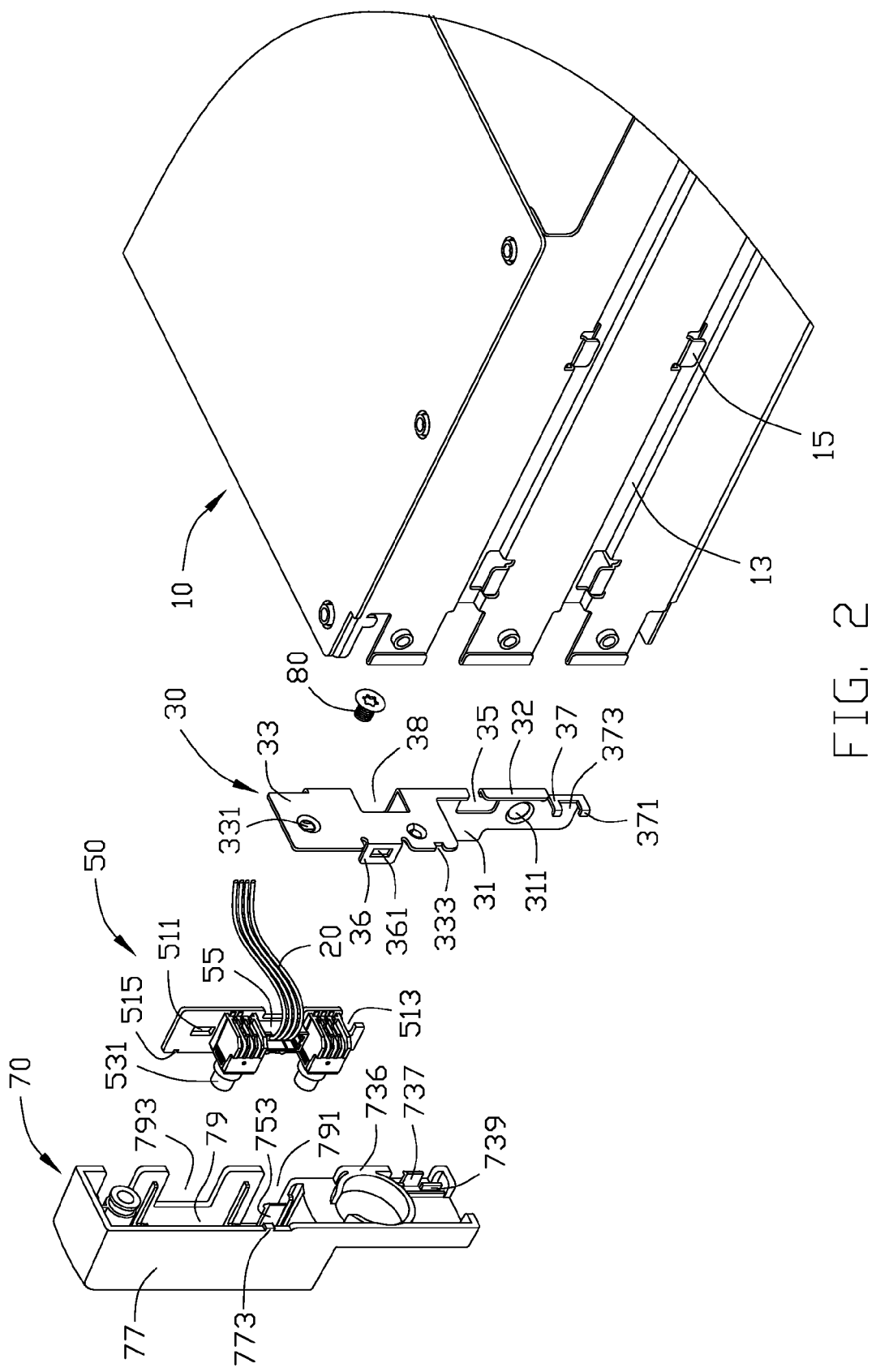
FIG. 2 is an exploded, isometric view of the server enclosure similar to FIG. 1, but viewed in another aspect.

Referring to FIGS. 1 and 2, a server enclosure in accordance with a preferred embodiment of the present invention includes a chassis 10, a securing bracket 30 mounted to the chassis 10, a switch module 50 for powering the server on/off, and a receiving member 70 for receiving the switch module 50.

The chassis 10 includes a bottom wall 11 and a sidewall 12 perpendicular to the bottom wall. A plurality of cabinets is defined in the chassis 10 for receiving electronic devices (only one shown). A plurality of securing portions 121 aligned in a vertical direction is formed at a front end of the sidewall 12. Two receiving slots 13 parallel to each other are defined in the sidewall 12 in a horizontal direction. A plurality of blocking tabs 15 respectively protrudes up or down from lower or upper edges of the receiving slots 13.

The securing bracket 30 is substantially L-shaped, including a first sidewall 31 attached to the sidewall 12 of the chassis 10 and a second sidewall 33 perpendicularly extending from an edge of an upper portion of the first sidewall 31. A plurality of securing holes 311 corresponding to the securing portions 121 of the chassis 10 is defined in the first sidewall 31 in a vertical direction. A tab 32 perpendicular bent from an edge of a middle portion of the first sidewall 31. A first opening 35 is defined in the middle portion of the first sidewall 31 above the tab 32. A securing latch 37 extends from an edge of a lower portion of the first sidewall 31. The securing latch 37 includes two bent securing arms 371 and a slot 373 defined therebetween. A securing hole 331 is defined in an upper portion of the second sidewall 33. A securing tab 36 with a slot 361 defined therein extends from an edge of a middle portion of the second sidewall 33 in a same direction as the first sidewall 31. A first cutout 333 is defined at an edge of the second sidewall 33 below the securing tab 36. A second opening 38 is defined at a joint of the first sidewalls 31 and second sidewalls 33.

The switch module 50 includes a rectangular printed circuit board (PCB) 51 and two switch members 53 spacedly disposed thereon and electrically connected with the PCB 51. A button 531 protrudes from a side of each of the switch members 53 in a direction parallel to the PCB 51. A connector 55 is disposed between the two switch members 53. A set of cables 20 extends from the connector 55 for electrically connecting the switch module 50 to a motherboard of the server. A slot 511 and a second cutout 513 are defined in the PCB 51 at an upper end and a lower end thereof respectively, adjacent to the two switch members 53. A third cutout 515 is defined at en edge of the PCB adjacent to the button 531.

Figure 3:
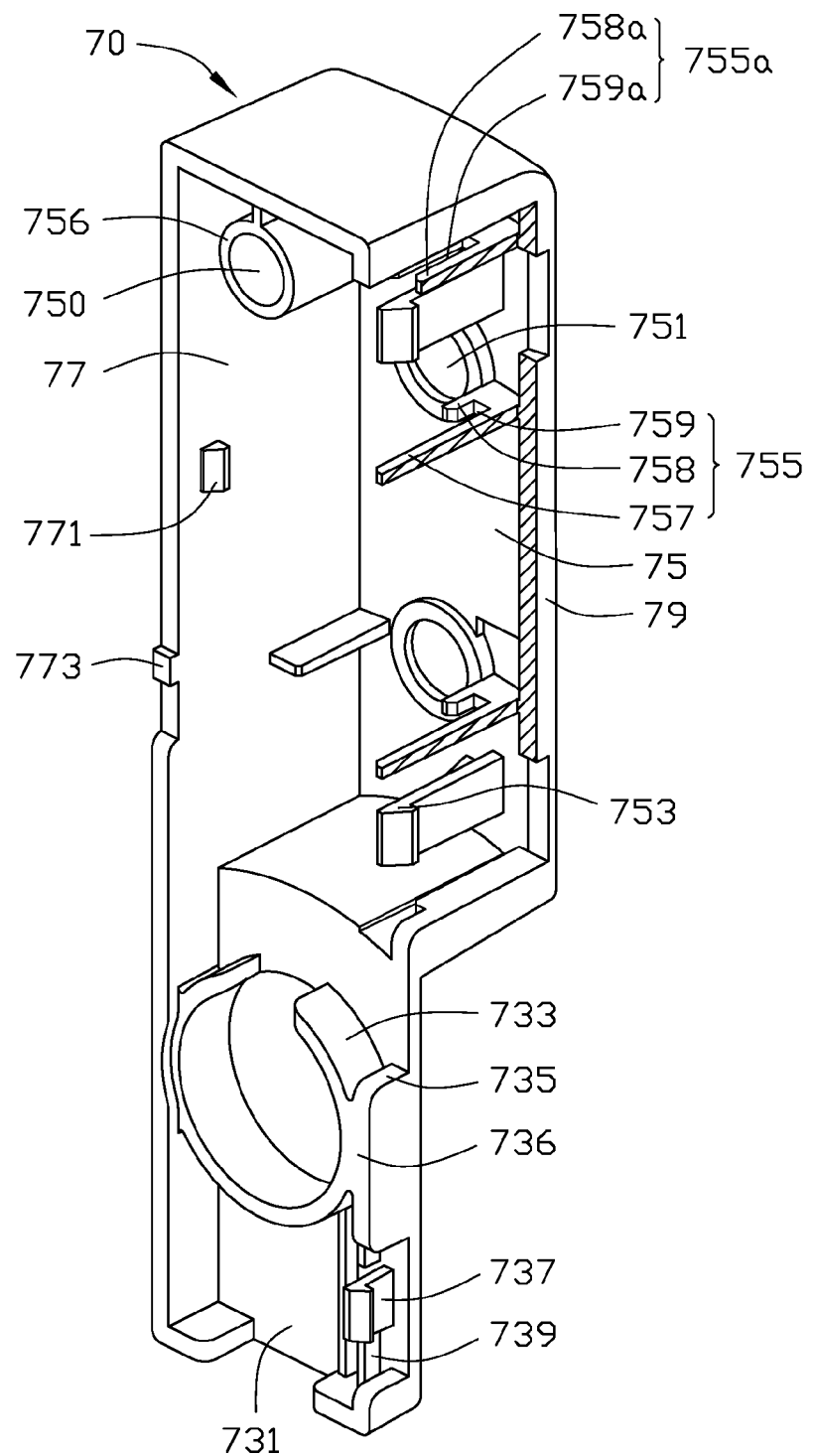
FIG. 3 is an enlarged, partially cut-away, isometric view of the receiving member.

Referring also to FIG. 3, the receiving member 70 is thin and longitudinal, substantially L-shaped, including a receiving portion 71 and a thin rectangular extending portion 73 longitudinally extending from an end of the receiving portion 71. An annular blocking member 733 protrudes from the extending portion 73. A rectangular blocking tab 735 connected to the annular blocking member 733 extends from an edge of the extending portion 73. A blocking plane 736 is determined by the connected top edges of the annular blocking member 733 and the blocking tab 735. A first elastic hook 737 protrudes from the bottom wall 731 under the blocking tab 735 for engaging with the slot 373 of the securing latch 37 of the securing bracket 30. Two blocking protrusion 739 are respectively formed at two sides of the first elastic hook 737 corresponding to the bent securing arms 371. The receiving portion 71 includes a bottom wall 75, a first sidewall 79, and a second sidewall 77, which together define a housing for receiving the switch module 50. A pair of holes 751 is spacedly defined in the bottom wall 75 corresponding to the buttons 531 of the switch module 50, for the buttons 531 extending therethrough and being exposed outside the receiving member 70. Two second elastic hooks 753 respectively corresponding to the slot 511 and the second cutout 513 of the PCB 51 spacedly protrude from the bottom wall 75 adjacent to the first sidewall 79. Two first blocking members 755 protrude from the bottom wall 75 between the two second elastic hooks 753. Each of the first blocking members 755 includes a short arm 759 and a long arm 757 connected with the first sidewall 79. A receiving slot 759 is defined between the short arm 759 and the long arm 757. A second blocking member 755a aligned with the first blocking member 755 protrudes from an upper end of the bottom wall 75. The second blocking member 755a includes a pair of opposite equal arms 758a. A securing slot 759a is defined between the pair of arms 758a. A post 756 protrudes from the upper portion of the bottom wall 75 adjacent to the second blocking member 755a. A securing hole 750 is defined in a center of the post 756 corresponding to the securing hole 331 in the securing bracket 30. Two slots 791 and 793 are defined in the first sidewall 79 respectively corresponding to the first opening 35 and the second opening 38 of the securing bracket 30. A wedge-shaped block 771 protrudes from an inner surface of the second sidewall 77 for engaging with the securing hole 361 of the securing tab 30. A positioning protrusion 773 corresponding to the first cutout 333 is formed at an edge of the second sidewall 77.

Figure 4:
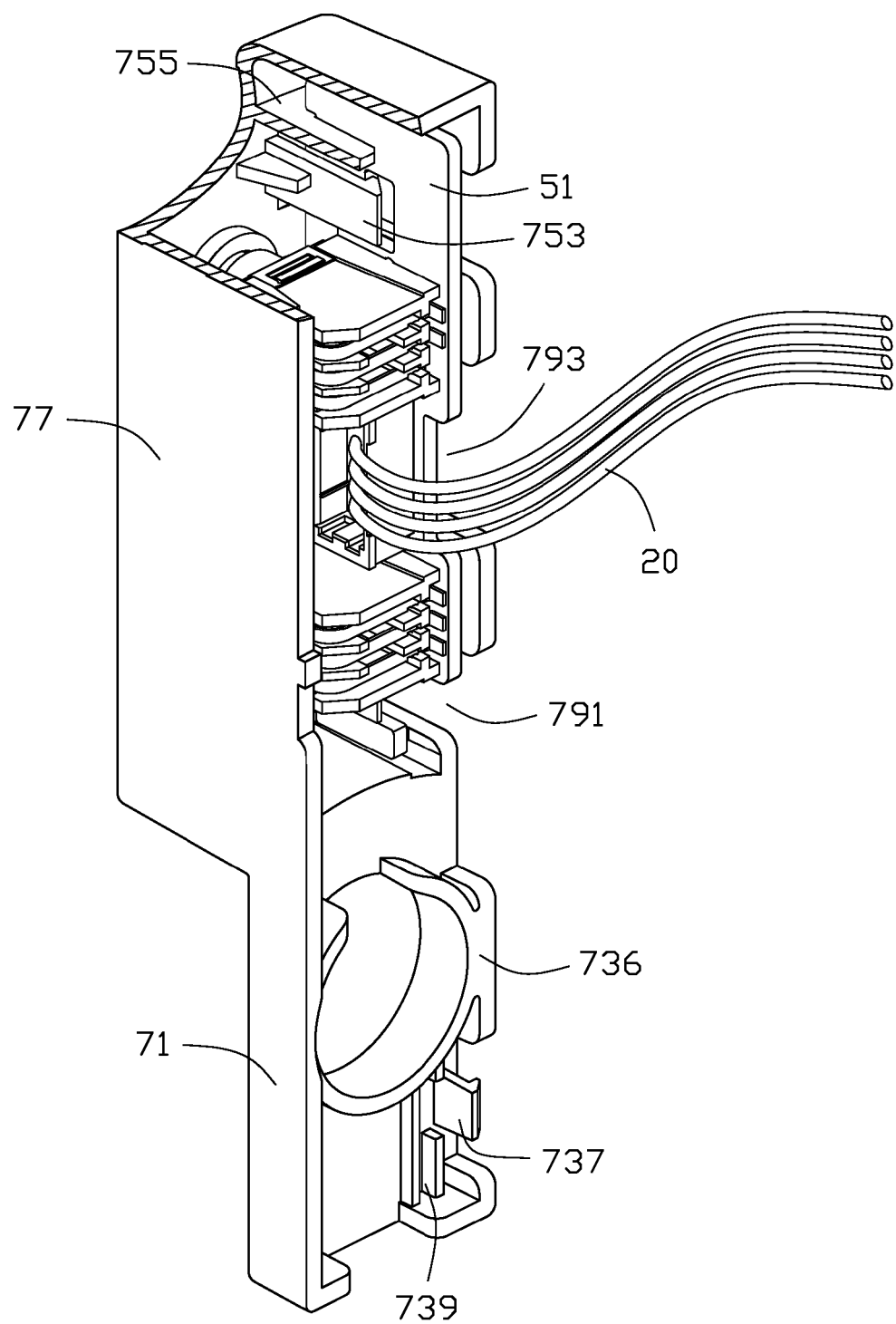
FIG. 4 is an enlarged assembled view of the switch module and the receiving member of FIG. 2.

Referring to FIG. 4, in assembly, the switch module 50 is pushed toward the bottom wall 75 of the receiving member 70. The PCB 51 of the switch module 50 is inserted in the first blocking members 755 and the second blocking member 755a along the arms 757 and 758a thereof. In the movement toward the bottom wall 75, the second elastic hooks 753 are deformed by the PCB 51. When the PCB 51 is received in the receiving slots 759 and 759a in the blocking members 755 and 755a, the second elastic hooks 753 respond back and respectively engage with the slot 511 and the second cutout 513 in the PCB 51. The third cutout 515 in the PCB 51 engages with the securing slot 759a of the second blocking member 755a. Thereby the PCB 51 is blocked between the second elastic hooks 753 and the first blocking members 755 and is secured in the receiving portion 71 of the receiving bracket 70. The buttons 531 of the switch member 53 extend through the holes 751 and are exposed outside the bottom wall 75 of the receiving portion 71 of the receiving member 70.

Figure 5:
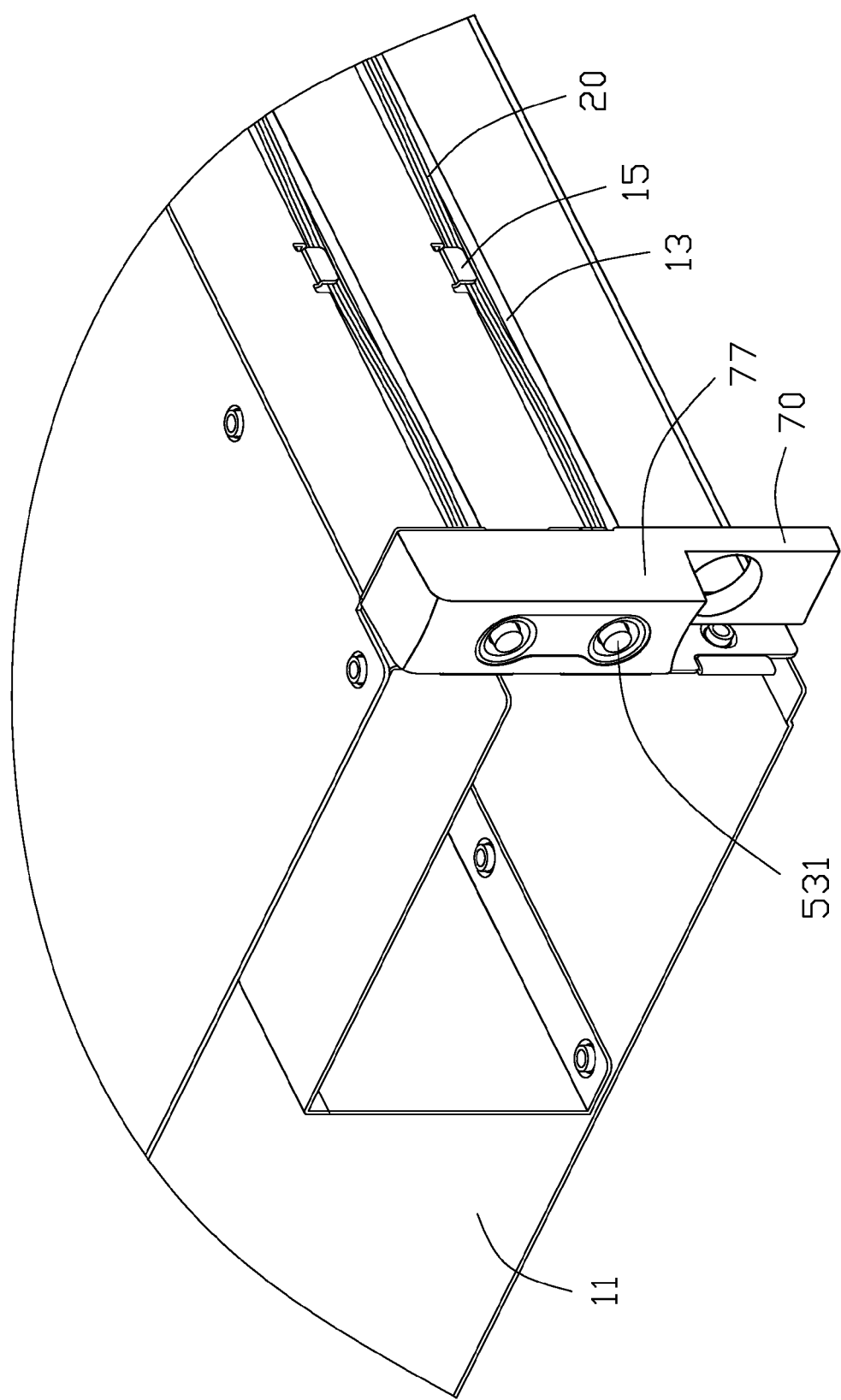
FIG. 5 is an assembled view of FIG. 1.
Figure 6:
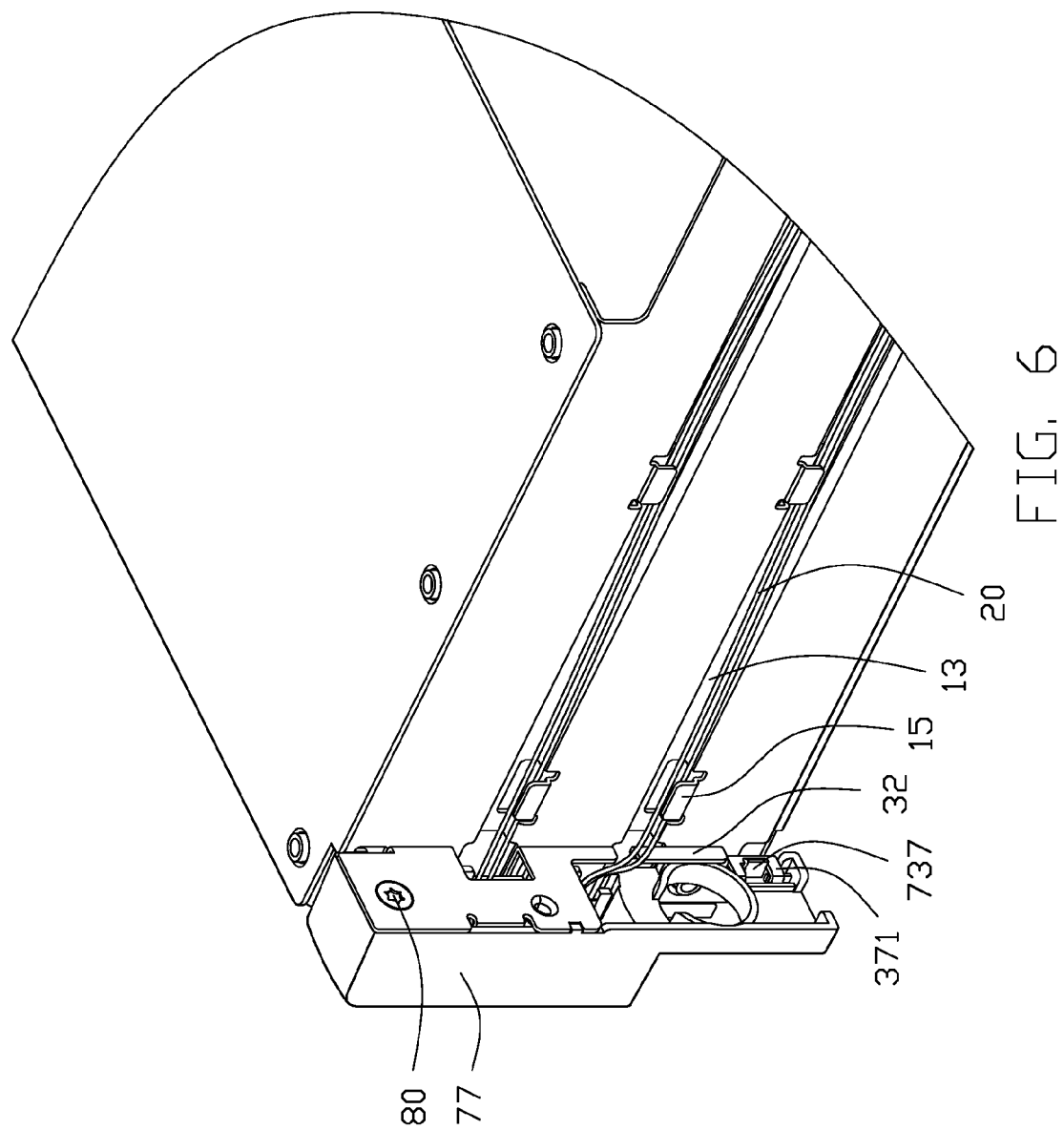
FIG. 6 is an assembled view of FIG. 2.

Referring also to FIGS. 5 and 6, the securing holes 311 of the securing bracket 30 are matched to the securing portions 121 of the sidewall 12 of the chassis 10, and the first sidewall 31 of the securing bracket 30 is riveted to the chassis 10 with the first sidewall 31 abutting against an outside of the sidewall 12 thereof. Then, the receiving member 70 with the switch module 50 is moved toward the securing bracket 30. The securing tab 36 extends into the receiving portion 71 of the receiving member 70 and is deformed by the wedge-shaped block 771. Meanwhile, the first elastic hook 737 of the extending portion 73 of the receiving member 70 is deformed by the securing latch 37 of the securing bracket 30. When the second sidewall 33 of the securing bracket 30 abuts on edges of the first and second sidewalls 77 and 79 of the receiving portion 71 of the receiving member 70, the securing tab 36 of the securing bracket 30 and the second elastic hook 739 of the receiving member 70 recoil. The wedge-shaped block 771 engages in the securing slot 361, and the first elastic hook 737 engages with the slot 373 of the securing latch 37. The blocking tab 32 abuts on the blocking plane 736 of the extending portion 73 of the receiving member 70. The positioning protrusion 773 of the receiving member 70 fits in the first cutout 333. Thus, movement of the receiving member 70 relative to the securing bracket 30 in directions parallel to the sidewall 12 of the chassis 10 is limited. In addition, the bent securing arms 371 are blocked by the blocking protrusion 739. The securing tab 36 abuts against an inner surface of the second sidewall 77 of the receiving portion 71. Thereby movement of the receiving member 70 relative to the securing bracket 30 in directions perpendicular to the sidewall 12 of the chassis 10 is limited. Thus, the receiving member 70 is secured to the securing bracket 30 and attached to the outside of the sidewall 12 of the chassis 10. The extending direction in length of the receiving member 70 is parallel to the sidewall 12 of the chassis. Further, a fastener 80 extends through the securing holes 331 and 750 of the securing bracket 30 and the receiving member 70, thereby securely fastening the receiving member 70 to the securing bracket 30. The first opening 35 and the second opening 38 are aligned with the receiving slots 13. The set of cables 20 is separated into two groups of cables 20. One group of cables 20 extends through the slot 791 in the receiving member 70 and the first opening 35 in the securing bracket 30 and is received in the lower receiving slot 13 of the chassis 10. The other group of cables 20 extends through the slot 793 in the receiving member 70 and the second opening 38 in the securing bracket 30 and is received in the upper receiving slot 13 of the chassis 10.

It is to be understood that the similar structure could be used for mounting a USB connector to a server enclosure.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server enclosure, comprising:
   a chassis having a sidewall;
   a securing bracket secured to the chassis, comprising a first sidewall and a second sidewall perpendicularly extending therefrom, the first sidewall abutting against the sidewall of the chassis and secured thereto;
   a switch module for powering the server on/off, comprising a printed circuit board; and
   a receiving member attached to the second sidewall of the securing bracket, the receiving member comprising a first sidewall abutting the first sidewall of the securing bracket, the switch module received in the receiving member with the printed circuit board parallel to the first sidewall of the receiving member; the second sidewall of the securing bracket abutting on the receiving member to enclose the switch module in the receiving member.

2. The server enclosure as described in claim 1, wherein the receiving member comprises a receiving portion and an extending portion, the receiving portion comprises a second sidewall opposite to the first sidewall of the receiving member, and a bottom wall perpendicular to the first and second sidewalls of the receiving member.

3. The server enclosure as described in claim 2, wherein a wedge-shaped block protrudes from an inner surface of the second sidewall of the receiving portion, an elastic securing tab is perpendicularly bent from the second sidewall of the securing bracket, and a securing slot is defined in the securing tab for the wedge-shaped block engaging therein.

4. The server enclosure as described in claim 2, wherein a first elastic hook protrudes from the extending portion of the receiving member, and two blocking protrusions are respectively formed at two sides of the elastic hook, a securing latch perpendicularly extends from the first sidewall of the securing bracket, the securing latch comprises two bent arms engaging with the blocking protrusions, and a slot is defined between the two arms for the elastic hook engaging therewith.

5. The server enclosure as described in claim 2, wherein a slot and a cutout are defined in the printed circuit board respectively, and two second elastic hooks protrudes from the bottom wall of the receiving member adjacent to the first sidewall thereof for engaging with the slot and the cutout respectively.

6. The server enclosure as described in claim 5, wherein two blocking members connected to the first sidewall of the receiving member protrudes from the bottom wall between the two second elastic hooks, and each blocking member comprises a long arm and a short arm, a receiving slot is defined between the long arm and the short arm for receiving an edge of the printed circuit board, and the printed circuit board is retained between the second elastic hooks and the long arms of the blocking members.

7. The server enclosure as described in claim 2, wherein an annular blocking member protrudes from the extending portion of the receiving member, and a rectangular blocking tab extending from an edge of the extending portion is connected to the annular blocking member and together determine a blocking plane, a blocking tab perpendicular protruding from the first sidewall of the securing bracket abuts against the blocking plane.

8. The server enclosure as described in claim 2, wherein a first securing hole is defined in the second sidewall of the securing bracket, and a post with a second securing hole defined in the center thereof protrudes from the bottom wall of the receiving member, a fastener extends through the first and second securing holes to secure the receiving member to the securing bracket.

9. The server enclosure as described in claim 2, wherein the switch module further comprises two switch members disposed on the printed circuit board, and two buttons respectively extends from the two switch members in a direction parallel to the printed circuit board, two holes are defined in the bottom wall of the receiving member for the two buttons extending therethrough respectively and exposed outside the receiving member.

10. A server enclosure, comprising:
a chassis comprising a sidewall;
a securing bracket fastened at a front end of the sidewall of the chassis and located outside thereof;
an elongated receiving member secured to the securing bracket and attached to the chassis outside the sidewall, a lengthwise direction of the receiving member parallel to the sidewall of the chassis; and
a switch module accommodated in the receiving member, comprising a printed circuit board perpendicularly inserted in the receiving member, the print circuit board substantially parallel to the sidewall of the chassis, the securing bracket abutting on the receiving member to enclose the switch module in the receiving member.

11. The server enclosure as described in claim 10, wherein at least one horizontally oriented receiving slot is defined outside the sidewall of the chassis from the front end thereof through a rear end thereof, and the lengthwise direction of the receiving member is perpendicular to that of the at least one receiving slot.

12. The server enclosure as described in claim 11, wherein the switch module further comprises two switch members arranged on the printed circuit board and a connector disposed therebetween, and a set of cables extends from the connector and are received in the at least one receiving slot.

13. The server enclosure as described in claim 12, wherein a plurality of blocking tabs respectively protrudes up or down from lower or upper edges of the at least one receiving slot for limiting the cables therein.

14. The server enclosure as described in claim 12, wherein the securing bracket comprises a first sidewall and a second sidewall perpendicular to the first sidewall of the securing bracket, at least one opening is defined at a joint of the first and second sidewalls, and the receiving member comprises first sidewall abutting the first sidewall of the securing bracket, at least one slot is defined in the sidewall of the receiving member, the cables extends through the at least one opening and slot and are received in the at least one receiving slot.

15. The server enclosure as described in claim 14, wherein the receiving member comprises a second sidewall opposite to the first sidewall and a bottom wall perpendicular to the first and second sidewalls, and a wedge-shaped block protrudes from an inner surface of the second sidewall, an elastic securing tab perpendicularly bent from the second sidewall of the securing bracket, and a securing slot is defined in the securing tab for the wedge-shaped block engaging therein.

16. The server enclosure as described in claim 15, wherein two buttons respectively extends from the two switch members in a direction parallel to the printed circuit board, two holes is defined in the bottom wall of the receiving member for the two buttons extending therethrough respectively and exposed outside the receiving member.

* * * * *